(12) United States Patent
Wadayama et al.

(10) Patent No.: US 8,778,841 B2
(45) Date of Patent: Jul. 15, 2014

(54) PRECURSOR FOR A $NB_3SN$ SUPERCONDUCTOR WIRE, METHOD FOR MANUFACTURING THE SAME, $NB_3SN$ SUPERCONDUCTOR WIRE, AND SUPERCONDUCTING MAGNET SYSTEM

(75) Inventors: Yoshihide Wadayama, Hitachiota (JP); Katsumi Ohata, Tsuchiura (JP); Kazuhiko Nakagawa, Tsuchiura (JP); Morio Kimura, Kasumigaura (JP)

(73) Assignee: SH Copper Products Co., Ltd., Tsuchiura, Ibaraki (JP)

( * ) Notice: Subject to any disclaimer, the term of this patent is extended or adjusted under 35 U.S.C. 154(b) by 118 days.

(21) Appl. No.: 13/137,998

(22) Filed: Sep. 23, 2011

(65) Prior Publication Data

US 2012/0149579 A1    Jun. 14, 2012

(30) Foreign Application Priority Data

Dec. 14, 2010    (JP) .................................. 2010-277878

(51) Int. Cl.
*H01L 39/24*    (2006.01)
(52) U.S. Cl.
USPC ....................................................... 505/510
(58) Field of Classification Search
USPC ........... 505/510, 430, 500; 420/425; 428/636, 428/656
See application file for complete search history.

(56) References Cited

U.S. PATENT DOCUMENTS

| 2006/0289836 A1 | 12/2006 | Egawa et al. |
| 2007/0004597 A1 | 1/2007 | Kubo et al. |
| 2012/0108437 A1* | 5/2012 | Ohata et al. .................. 505/231 |

FOREIGN PATENT DOCUMENTS

| EP | 0 618 627 A1 | 10/1994 |
| JP | 04-289615 A | 10/1992 |
| JP | 8-180752 (A) | 7/1996 |
| JP | 2010-97902 A | 4/2010 |

OTHER PUBLICATIONS

European Search Report Dated Sep. 24, 2013.
Notification of Reasons for Refusal with English Translation dated Apr. 8, 2014.

* cited by examiner

*Primary Examiner* — Colleen Dunn
(74) *Attorney, Agent, or Firm* — McGinn IP Law Group, PLLC

(57) ABSTRACT

A precursor for a $Nb_3Sn$ superconductor wire to be manufactured by the internal diffusion method. The precursor includes Nb-based single core wires, Sn-based single core wires, and a cylindrical diffusion barrier made of Ta or Nb. Each Nb-based single core wire includes a Nb-based core coated with a Cu-based coating made of a Cu-based matrix. Each Sn-based single core wire includes a Sn-based core coated with a Cu-based coating made of a Cu-based matrix. The Nb-based single core wires and the Sn-based single core wires are regularly disposed in the diffusion barrier. The Nb-based single core wires includes at least two kinds of Nb-based single core wires having different Cu/Nb ratios and the Cu/Nb ratio is a cross sectional area ratio of the Cu-based coating to the Nb-based core.

10 Claims, 8 Drawing Sheets

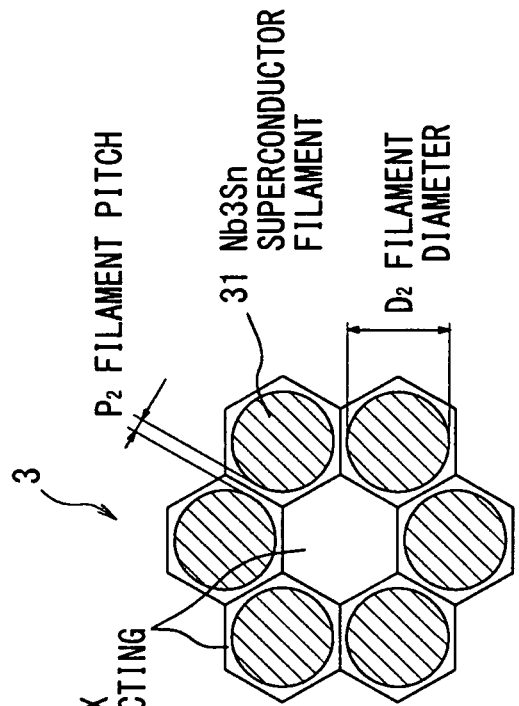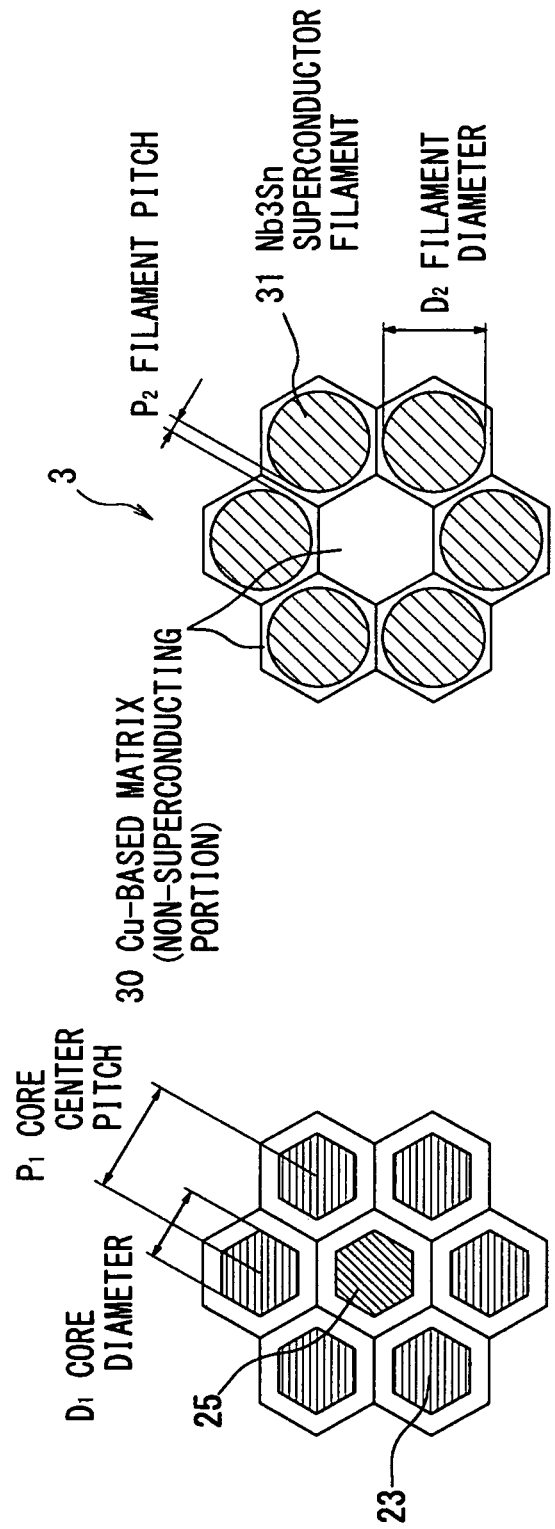

PRECURSOR FOR A $Nb_3Sn$ SUPERCONDUCTOR WIRE, METHOD FOR MANUFACTURING THE SAME, $Nb_3Sn$ SUPERCONDUCTOR WIRE, AND SUPERCONDUCTING MAGNET SYSTEM

The present application is based on Japanese Patent Application No. 2010-277878 filed on Dec. 14, 2010, the entire contents of which are incorporated herein by reference.

BACKGROUND OF THE INVENTION

1. Field of the Invention

The present invention relates to a precursor for a $Nb_3Sn$ superconductor wire, a method for manufacturing the same, a $Nb_3Sn$ superconductor wire and a superconducting magnet system. More particularly, the invention relates to a precursor for a $Nb_3Sn$ superconductor wire to be manufactured by internal diffusion method, which is provided with both excellent critical current characteristics and magnetic stability, a method for manufacturing the same, a $Nb_3Sn$ superconductor wire and a superconducting magnet system. Herein, the "precursor" is a structure prior to final formation of the superconductor wire by the heat treatment.

2. Related Art

As technical fields to which the superconductor wire is applied, there are nuclear magnetic resonator analyzing apparatus and magnetic resonance imaging apparatus, for which the superconductor wire is used because of the magnetic field with a time stability in a persistent current mode. Particularly, in a permanent magnet for a nuclear magnetic resonance apparatus (NMR), application of the superconductor wire having high current density in high magnetic field is demanded, so as to realize higher resonance frequency, higher resolution performance and downsizing of the system.

Here, the $Nb_3Sn$ superconductor wire manufactured by the internal diffusion method has been known. According to the internal diffusion method, the $Nb_3Sn$ superconductor wire is manufactured by disposing Nb-based (i.e. Nb or Nb-alloy) cores, Sn-based (i.e. Sn or Sn-alloy) cores within a Cu-based (i.e. Cu or Cu-alloy) matrix in a precursor cross section, and reacting Sn of the Sn-based core with Nb via the Cu-based matrix by heat treatment, thereby generating $Nb_3Sn$. The internal diffusion method is advantageous in comparison with the bronze method, since a large quantity of Sn can be provided so that a thickness of the generated $Nb_3Sn$ is large and the critical current density can be increased.

While the bronze method is a method for manufacturing $Nb_3Sn$ by reacting a precursor containing Cu—Sn-alloy and Nb-based cores, the internal diffusion method is a method for manufacturing $Nb_3Sn$ by reacting the precursor having the aforementioned structure, so that there is no bronze (Cu—Sn-alloy) in the precursor.

However, in the internal diffusion method, there is a disadvantage in that a space required for disposing Sn is greater than that in the bronze method, so that the Nb-based cores should be disposed in a limited space. Therefore, in the case that the Nb-based cores having the same cross sectional area as that in the bronze method are disposed, a spacing between the respective Nb-based cores is inevitably reduced. Due to these factors, adjacent $Nb_3Sn$ superconductor filaments are magnetically coupled to each other, so that alternative current (AC) loss is increased. Further, in the case that the degree of the magnetic coupling between the superconductor filaments is extremely large, the superconductor wire causes a magnetic jump (flux jump). As a result, when such a superconductor wire is applied to the magnet system, it is impossible to energize the superconductor wire up to the originally designed critical current.

As the $Nb_3Sn$ superconductor wire made by the internal diffusion method, by which the AC loss can be reduced while high critical current density is maintained, a $Nb_3Sn$ superconductor wire in which Sn elements and Nb elements are dispersively disposed and the Nb elements are divided into plural sections by the Sn elements in the precursor cross section has been known. For example, Japanese Patent Laid-Open No. 2010-97902 (JP-A 2010-97902) discloses such a $Nb_3Sn$ superconductor wire. JP-A 2010-97902 discloses that, in the cross section of the $Nb_3Sn$ superconductor wire obtained by heat-treating the precursor, a $Nb_3Sn$ core-dense region is divided by non-superconducting regions in which Sn has existed before reaction, so that the coupling between the respective superconducting regions is suppressed.

SUMMARY OF THE INVENTION

However, according to the $Nb_3Sn$ wire obtained by the method disclosed in JP-A 2010-97902, although it is possible to reduce the AC loss, disposition of the Nb elements and the Sn elements is not uniform, Sn concentration varies in accordance with each location. As a result, there is a distribution in the critical current performance of the $Nb_3Sn$ core generated by the diffusion reaction, so that an occupation ratio of the $Nb_3Sn$ core having high critical current is not so high.

Accordingly, it is an object of the invention is to provide a precursor for a $Nb_3Sn$ superconductor wire which is provided with excellent critical current characteristics, reduced AC loss and excellent magnetic stability, a method for manufacturing the same, a $Nb_3Sn$ superconductor wire and a superconducting magnet system.

According to a feature of the invention, a precursor for a $Nb_3Sn$ superconductor wire to be manufactured by the internal diffusion method comprises:

a plurality of Nb-based single core wires, each of which comprises a Nb-based core coated with a Cu-based coating comprising a Cu-based matrix, a plurality of Sn-based single core wires, each of which comprises a Sn-based core coated with a Cu-based coating comprising a Cu-based matrix; and a cylindrical diffusion barrier comprising Ta or Nb, in which the plurality of Nb-based single core wires and the plurality of Sn-based single core wires are regularly disposed, in which the plurality of Nb-based single core wires comprises at least two kinds of Nb-based single core wires having different Cu/Nb ratios, in which a Cu/Nb ratio is a cross sectional area ratio of the Cu-based coating to the Nb-based core.

In the precursor for a $Nb_3Sn$ superconductor wire, the plurality of Nb-based single core wires may comprise Nb-based single core wires having the Cu/Nb ratio of 0.4 or more.

In the precursor for a $Nb_3Sn$ superconductor wire, the Nb-based single core wires having the Cu/Nb ratio of 0.4 or more may be radially arranged in a cross section of the precursor.

According to another feature of the invention, a precursor for a $Nb_3Sn$ superconductor wire to be manufactured by the internal diffusion method comprises:

a plurality of Nb-based single core wires, each of which comprises a Nb-based core coated with a Cu-based coating comprising a Cu-based matrix, a plurality of Sn-based single core wires, each of which comprises a Sn-based core coated with a Cu-based coating comprising a Cu-based matrix; and a cylindrical diffusion barrier comprising Ta or Nb, in which the plurality of Nb-based single core wires and the plurality of Sn-based single core wires are regularly disposed, in which the plurality of Nb-based single core wires comprise Nb-based single core wires having a Cu/Nb ratio of 0.4 or more, in which the Cu/Nb ratio is a cross sectional area ratio of the Cu-based coating to the Nb-based core.

In the precursor for a $Nb_3Sn$ superconductor wire, it is preferable that a diameter of a region, in which Nb-based single core wires having the Cu/Nb ratio of less than 0.4 are adjacent to each other, is 300 μm or less.

The precursor for a $Nb_3Sn$ superconductor wire may further comprise a plurality of segments, in each of which Nb-based single core wires having the Cu/Nb ratio of less than 0.4 are arranged to be adjacent to each other around one Sn-based single core wire, in which the segments are sectioned by the Nb-based single core wires having the Cu/Nb ratio of 0.4 or more and the Sn-based single core wires.

According to a still another feature of the invention, a precursor for a $Nb_3Sn$ superconductor wire to be manufactured by the internal diffusion method comprises:

a plurality of Nb-based single core wires, each of which comprises a Nb-based core coated with a Cu-based coating comprising a Cu-based matrix, a plurality of Sn-based single core wires, each of which comprises a Sn-based core coated with a Cu-based coating comprising a Cu-based matrix; and a cylindrical diffusion barrier comprising Ta or Nb, in which the plurality of Nb-based single core wires and the plurality of Sn-based single core wires are regularly disposed, in which a core center pitch of the Nb-based core is 1.2 times or more of a core diameter of the Nb-based core.

According to a further feature of the invention, a method for manufacturing a precursor for a $Nb_3Sn$ superconductor wire comprises:

coating a Nb-based core with a Cu-based matrix to provide a plurality of Nb-based single core wires;

coating a Sn-based core with a Cu-based matrix to provide a plurality of Sn-based single core wires;

inserting the plurality of Nb-based single core wires and the plurality of Sn-based single core wires that are bundled regularly into a cylindrical diffusion barrier comprising Ta or Nb; and inserting a bulk comprising the plurality of Nb-based single core wires, the plurality of Sn-based single core wires and the diffusion barrier into a Cu-tube;

in which each of the Nb-based single core wires and each of the Sn-based single core wires are same in an outer periphery shape and different from each other in a Cu-coating ratio.

According to a still further feature of the invention, a method for manufacturing a precursor for a $Nb_3Sn$ superconductor wire comprises:

coating a Nb-based core with a Cu-based matrix to provide a plurality of Nb-based single core wires;

coating a Sn-based core with a Cu-based matrix to provide a plurality of Sn-based single core wires;

inserting the plurality of Nb-based single core wires and the plurality of Sn-based single core wires that are bundled regularly into a cylindrical diffusion barrier comprising Ta or Nb; and inserting a bulk comprising the plurality of Nb-based single core wires, the plurality of Sn-based single core wires and the diffusion barrier into a Cu-tube;

in which the plurality of Nb-based single core wires comprises at least two kinds of Nb-based single core wires having different Cu/Nb ratios, in which a Cu/Nb ratio is a cross sectional area ratio of the Cu-based coating to the Nb-based core.

A $Nb_3Sn$ superconductor wire manufactured by diffusion-reacting the Nb-based core and Sn-based core by heat-treating the precursor according to the feature of the invention may comprise:

a first region comprising a first filament pitch; and
a second region comprising a second filament pitch greater than the first filament pitch, in which the first region is divided into a plurality of segments by the second region.

A $Nb_3Sn$ superconductor wire manufactured by diffusion-reacting the Nb-based core and Sn-based core by heat-treating the precursor according to the feature of the invention may comprise:

a first region comprising a first filament pitch; and
a second region comprising a second filament pitch greater than the first filament pitch, in which the second filament pitch is 0.5 μm or more.

In a $Nb_3Sn$ superconductor wire manufactured by diffusion-reacting the Nb-based core and Sn-based core by heat-treating the precursor according to the feature of the invention, a crystal structure and a Sn concentration distribution may be axially symmetrical with respect to a center axis of a filament.

In a $Nb_3Sn$ superconductor wire manufactured by diffusion-reacting the Nb-based core and Sn-based core by heat-treating the precursor according to the feature of the invention, a non-reacted Nb core may remain at a center of a superconductor filament.

A superconductor magnet system may comprise an electric circuit comprising a coil made by winding the $Nb_3Sn$ superconductor according to the another feature of the invention and a persistent current switch connected in series to both ends of the coil.

Effects of the Invention

According to the invention, it is possible to provide a precursor for a $Nb_3Sn$ superconductor wire which is provided with excellent critical current characteristics, reduced AC loss and excellent magnetic stability, a method for manufacturing the same, a $Nb_3Sn$ superconductor wire and a superconducting magnet system.

BRIEF DESCRIPTION OF THE DRAWINGS

Next, a precursor for a $Nb_3Sn$ superconductor wire, a method for manufacturing the same, a $Nb_3Sn$ superconductor wire and a superconducting magnet system in embodiments according to the invention will be explained in conjunction with appended drawings, wherein:

FIGS. 2A and 2B are explanatory diagrams of the a precursor for $Nb_3Sn$ superconductor wire, wherein FIG. 2A is a cross sectional view of a segment of a precursor for $Nb_3Sn$ superconductor wire showing a core diameter of a Nb core and a core center pitch between the Nb cores, and FIG. 2B is a cross sectional view of a segment of a superconductor wire after heat treatment showing a filament diameter of a superconductor filament and a filament pitch between the superconductor filaments;

DETAILED DESCRIPTION OF THE EMBODIMENTS

Embodiments

Figure 1:
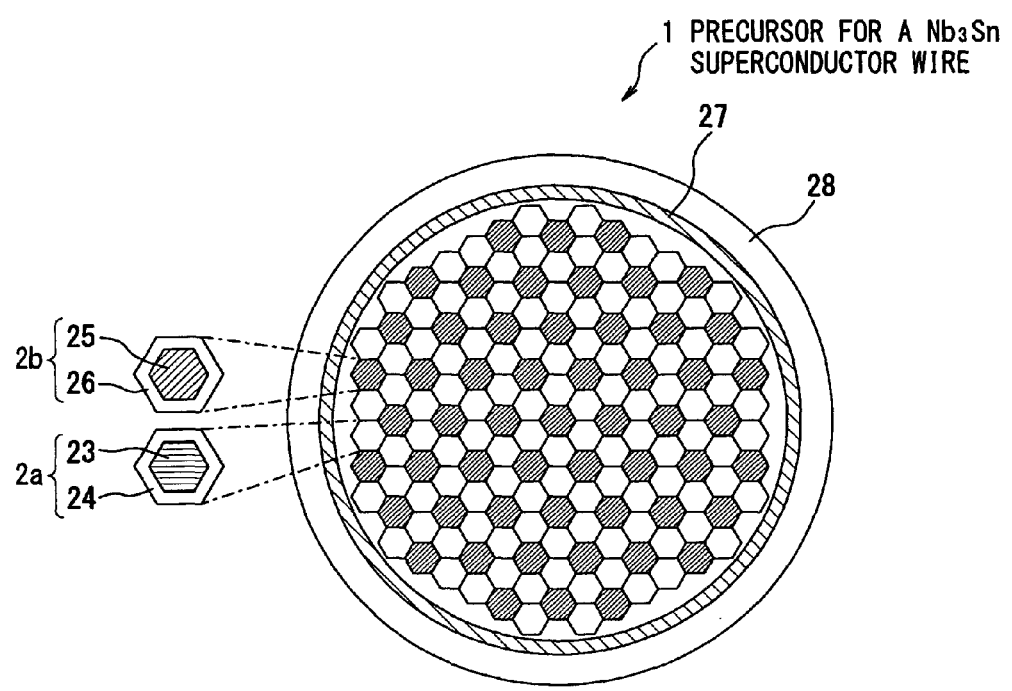
FIG. 1 is a cross-sectional view of a precursor for $Nb_3Sn$ superconductor wire schematically showing an example of a basic structure thereof.

In one embodiment, a $Nb_3Sn$ superconductor wire is a $Nb_3Sn$ wire manufactured by the internal diffusion method. In a cross sectional structure of this $Nb_3Sn$ superconductor wire, regions with a high occupation ratio of $Nb_3Sn$ filaments is divided by regions with a low occupation ratio of the $Nb_3Sn$ filaments. According to this structure, in the region with the high occupation ratio of the $Nb_3Sn$ filaments, the magnetic coupling (inductive coupling) between filaments is partially allowed so that the high critical current density can be securely provided. Further, the magnetic coupling in the regions with the high occupation ratio of the $Nb_3Sn$ filaments are divided by the regions with the low occupation ratio of the $Nb_3Sn$ filaments, so it is possible to suppress formation of a large magnetically-coupled region, thereby avoiding the magnetic instability. Therefore, according to the $Nb_3Sn$ superconductor wire in the present embodiment, it is possible to realize the excellent critical current density and AC loss characteristic at the same time over an entire cross section of the superconductor wire.

More specifically, a precursor for a $Nb_3Sn$ superconductor wire manufactured by the internal diffusion method in the present embodiment is a precursor in which a plurality of Nb-based cores, each of which is coated with a Cu-based matrix at its outer periphery and a plurality of Sn-based cores, each of which is coated with a Cu-based matrix at its outer periphery are regularly disposed in a diffusion barrier. In other words, a plurality of Nb-based single core wires, each of which includes a Nb-based core coated with a Cu-based coating containing a Cu-based matrix, and a plurality of Sn-based single core wires, each of which includes a Sn-based core coated with a Cu-based coating containing a Cu-based matrix are regularly arranged in a cylindrical diffusion barrier made of Ta or Nb.

The diffusion barrier has a cylindrical shape and is made of Ta or Nb. A core center pitch between one Nb-based core and another Nb-based core adjacent to one Nb-based core is 1.2 times or more of a diameter of the Nb-based core.

The $Nb_3Sn$ superconductor wire may be formed by arranging at least two kinds of Nb-based single core wires having different Cu/Nb area ratios. Herein, the "Cu/Nb ratio" is a cross sectional area ratio of the Cu-based coating to the Nb-based core.

In addition, the precursor for a $Nb_3Sn$ superconductor wire may include a Nb-based single core wire having the Cu/Nb ratio of 0.4 or more. Further, in the precursor for a $Nb_3Sn$ superconductor wire, Nb-based single core wires having the Cu/Nb ratio of 0.4 or more may be radially arranged in its cross section. Namely, a series of the Nb-based single core wires aligned straightly from a center toward an outer periphery of the superconductor wire (i.e. in a radial direction).

In the precursor for a $Nb_3Sn$ superconductor wire, for the case that a region in which the Nb-based single core wires having the Cu/Nb ratio of less than 0.4 are adjacent to each other, a diameter of this region may be 300 μm or less. Further, in the precursor for a $Nb_3Sn$ superconductor wire, a plurality of segments, in each of which the Nb-based single core wires having the Cu/Nb ratio of less than 0.4 are arranged to be adjacent to each other around one Sn-based single core wire, may be sectioned by the Nb-based single core wires having the Cu/Nb ratio of 0.4 or more.

(Method for Fabricating the Precursor for a $Nb_3Sn$ Superconductor Wire)

The precursor for a $Nb_3Sn$ superconductor wire in the embodiment may be fabricated as follows.

At first, a Nb-based core, a Sn-based core and Cu-based matrix are prepared. Next, the Nb-based core and the Sn-based core are coated with the Cu-based matrix, respectively, to provide the Nb-based single core wires and the Sn-based single core wires. Successively, the Nb-based single core wires and the Sn-based single core wires are regularly bundled and inserted into a cylindrical diffusion barrier of Ta or Nb. Next, a bulk comprising the Nb-based single core wires, the Sn-based single core wires and the diffusion barrier is inserted into a Cu tube. In the present embodiment, it is preferable that an outer periphery of the Nb-based single core wire coated with the Cu-based matrix and an outer periphery of the Sn-based single core wire coated with the Cu-based matrix have the same outer periphery shape and different Cu-coating ratios.

Further, in the method for manufacturing the precursor for a $Nb_3Sn$ superconductor wire, two or more kinds of Nb-based single core wires having different Cu/Nb ratios may be disposed.

In another embodiment of the present invention, heat treatment is carried out on the precursor for a $Nb_3Sn$ superconductor wire such that the Nb-based cores and the Sn-based cores are diffusion-reacted with each other, so as to manufacture a $Nb_3Sn$ superconductor wire. The $Nb_3Sn$ superconductor wire formed by heat-treating the precursor for a $Nb_3Sn$ superconductor wire includes one region in which a pitch between the respective filaments is narrow (i.e. a narrow filament pith region) and another region in which a pitch between the respective filaments is greater than that of one region (i.e. a wide filament pitch region). In the present embodiment, the narrow filament pitch region is divided into plural segments by the wide filament pitch regions.

In addition, the $Nb_3Sn$ superconductor wire is formed to have a filament pitch of 0.5 μm or more as a spacing between the respective $Nb_3Sn$ filaments.

In the $Nb_3Sn$ superconductor wire formed by heat-treating the precursor for a $Nb_3Sn$ superconductor wire, the crystal structure and the Sn concentration distribution are axially symmetrical or substantially axially symmetrical with respect to a center axis of a superconductor filament. Further, in the $Nb_3Sn$ superconductor wire formed by heat-treating the precursor for a Nb$_3$Sn superconductor wire, a non-reacted Nb core may remain in a center of the superconductor filament.

Further, in a still another embodiment of the present invention, an electric circuit may be formed by connecting a persistent current circuit switch to both ends of a coil made by winding the Nb$_3$Sn superconductor wire in series.

Still further, it is possible to configure a superconducting magnet system including the aforementioned electric circuit, to which a magnetic resonance phenomenon with excellent superconducting stability is applied.

EXAMPLES

Next, the present invention will be explained below in more detail in conjunction with the Examples.

Example 1

FIG. 1 is a schematic diagram showing an example of basic structure of a precursor 1 for a Nb$_3$Sn superconductor wire. More specifically, FIG. 1 shows a cross sectional view of a basic structure of the precursor 1 for a Nb$_3$Sn superconductor wire in Example 1 (hereinafter, the "basic structure" means a configuration shown in FIG. 1 unless described otherwise.).

The precursor 1 for a Nb$_3$Sn superconductor wire in Example 1 includes a plurality of Nb single core wires 2a each of which comprises a Nb core 23 and a Cu-coating 24 (thick) for coating the Nb core 23 and a plurality of Sn single core wires 2b each of which comprises a Sn core 25 and a Cu-coating 26 for coating the Sn core 25, a diffusion barrier 27 for coating the Nb single core wires 2a and the Sn single core wires 2b that are disposed in a predetermined arrangement, and a stabilized Cu 28 contacting to an outer periphery of the diffusion barrier 27.

The precursor 1 for a Nb$_3$Sn superconductor wire having the above configuration is manufactured as explained below.

Firstly, a Nb rod (which will be processed into a Nb core 23 as a final configuration) with an outer diameter of 20 mm was inserted into a Cu pipe with an outer diameter of 25.5 mm and an inner diameter of 20.2 mm. Thereafter, the Cu pipe accommodating the Nb rod was processed by the area reduction process to have a hexagonal cross-section in which a spacing between opposite sides is 1.7 mm, thereby manufactured Nb single core wires (each of which comprises Nb coated with Cu-coating). In the meantime, a Sn-alloy rod (which will be processed into a Sn core 25 as a final configuration) having an outer diameter of 15.9 mm was inserted into a Cu pipe with an outer diameter of 19.4 mm and an inner diameter of 16.3 mm. Thereafter, the Cu pipe accommodating the Sn-alloy rod was processed by the area reduction process to have a hexagonal cross-section in which a spacing between opposite sides is 1.7 mm, thereby manufactured Sn single core wires (each of which comprises Sn coated with Cu-coating).

Next, referring to FIG. 1, the Nb single core wires 2a (72 in number) and the Sn single core wires 2b (37 in number) a total number of which is 109 are disposed in a Cu pipe (which will be processed into a stabilized Cu 28 as a final configuration) with an outer diameter of 25.6 mm and an inner diameter of 21.2 mm in a manner that one Sn single core wire was surrounded by a plurality of Nb single core wires (6 in number). Five layers (turns) of Ta-sheet (which will be processed into a diffusion barrier 27 as a final configuration) with a thickness of 0.2 mm was inserted between the Cu pipe and a bundle of the filaments. A multicore composite wire assembled as described above was processed by the area reduction process, to form a Nb$_3$Sn precursor with a wire diameter of 0.5 mm.

FIGS. 2A and 2B are explanatory diagrams showing a diameter of a Nb core and a core center pitch between Nb cores in the precursor for Nb$_3$Sn superconductor wire. More concretely, FIG. 2A is an explanatory diagram showing the diameter of the Nb core and the core center pitch between the Nb cores. FIG. 2B is a cross sectional view of a segment of the superconductor wire provided by heat-treating the precursor, namely, an explanatory diagram showing dimensions of the superconductor filament.

Firstly, referring to FIG. 2A, as a result of having measured a cross sectional structure of a segment of the precursor 1 before heat treatment, a core diameter $D_1$ of the Nb core 23 was 27 μm, and an interval $P_1$ between centers of the Nb cores 23 (i.e. the core center pitch $F_1$) was 34 μm.

Successively, heat treatment was carried out on the precursor 1 at a temperature of 210° C. for 100 hours, at a temperature of 400° C. for 50 hours, and at a temperature of 700° C. for 150 hours, thereby manufactured a Nb$_3$Sn superconductor wire. FIG. 2B shows an outline of the cross section of a segment of a Nb$_3$Sn superconductor wire 3 obtained by the heat treatment. In observation of the cross section of the Nb$_3$Sn superconductor wire 3, the Nb$_3$Sn superconductor wire 3 included regions in which the Sn cores 25 have existed before reaction (non-superconducting portions), Nb$_3$Sn superconductor filaments 31, and a Cu-based matrix 30 (a non-superconducting portion) located at an outer periphery of the Sn-core existed regions and the superconducting Nb$_3$Sn filaments 31.

Critical current density of this Nb$_3$Sn superconductor filament 31 was calculated as follows. A current value at the time of generating an electric field of 0.1 μV/cm was measured by direct current four-terminal method and the current value was divided by a cross section of non-Cu part of the filament. The critical current density of the Nb$_3$Sn filament obtained by the above process was about 1200 A/mm$^2$ in a magnetic field of 12 T.

In general, for evaluating the AC loss characteristic of the Nb$_3$Sn superconductor filament, the magnetization characteristic was measured with the use of a superconducting flux quantum interferometer (SQUID). Herein, as a reference for comparing the AC loss characteristic of the Nb$_3$Sn superconductor filament, an equivalent diameter of a superconductor filament (i.e. effective filament diameter) was used. The equivalent diameter is also used as an index for showing a coupling condition of the superconductor filament. Namely, when a distance between adjacent filaments (i.e. a filament pitch $P_2$) is small, the adjacent filaments are magnetically coupled to each other due to the proximity effect, the equivalent filament diameter will be greater than an actual diameter. The equivalent filament diameter ($d_{eff}$) is calculated by an equation as described below.

$$d_{eff} = (3\pi/2\mu_O) \cdot (\Delta M/Jc),$$

wherein, $d_{eff}$ is equivalent filament diameter, $\mu_O$ is space permeability expressed as $\mu_O = 4\pi \times 10^{-7}$, $\Delta M$ is magnetization hysteresis, and Jc is critical current density.

The equivalent filament diameter (the effective filament diameter) $d_{eff}$ in the magnetic field 3 T of the heat-treated Nb$_3$Sn superconductor wire was about 30 μm, which was approximately equal to a filament diameter $D_2$ of the Nb$_3$Sn superconductor filament 31. In other words, it was confirmed that the adjacent Nb$_3$Sn superconductor filaments 31 were not magnetically coupled to each other and that the Nb$_3$Sn superconductor filaments 31 had the excellent AC loss characteristic and magnetic stability.

Example 2 and Example 3

Next, the optimum condition of the Nb core pitch in the precursor for a Nb$_3$Sn superconductor is studied. Herein, the "Nb core pitch" is a ratio of the Nb core center pitch to the Nb core diameter.

For obtaining the optimum condition of the Nb core pith, precursor samples with the Cu/Nb ratio of 0.4 or more, in which a thickness of Cu-coating of the Nb single core wire was changed, were prepared in a similar manner to Example 1. Then, the magnetic characteristics of the samples after the heat treatment for generating Nb$_3$Sn were measured. In the manufacturing of the precursor, the final configuration of each single core wire was uniform, and the Nb core pitch was changed by adjusting the cross section ratio of Cu to Nb inside the Nb single core.

Comparative Example 1 and Comparative Example 2

Similarly to Examples 1 to 3, precursor samples with a ratio of Cu to Nb of less than 0.4, in which a thickness of Cu-coating of the Nb single core wire was changed, were prepared, and the magnetic characteristics of the samples after the heat treatment for generating Nb$_3$Sn were measured.

TABLE 1 shows measurement results of Nb core diameter, the Nb pitch, the Nb core center pitch, and the Nb core pitch of the precursors used in the experiment. The "Nb pitch" is an interval between outer peripheries of the adjacent Nb cores 23. The core diameter of the Nb core was changed within a range of about 25 to 30 μm and the pitch between the Nb cores was changed within a range of about 3 to 9 μm.

As described above, the "Nb core pitch" is a ratio of the Nb core center pitch $P_1$ to the Nb core diameter $D_1$. As a result of the experiment for determining the optimum condition of the Nb core pitch, when the ratio of the Nb core center pitch $P_1$ to the Nb core diameter $D_1$ was 1.2 or more, the magnetic coupling degree was small. When the ratio of the Nb core center pitch $P_1$ to the Nb core diameter $D_1$ was less than 1.2, the magnetic coupling degree was suddenly increased and flux jump was caused. The ratio of the Nb core center pitch $P_1$ to the Nb core diameter $D_1$ was at this time can be expressed by using the thickness of the Cu layer coated around an outer periphery of the Nb core or the Cu/Nb ratio. For example, it is preferable that the Cu/Nb ratio is about 0.4 or more. In other words, by providing the Nb core pitch of 1.2 or more or the Cu/Nb ratio of 0.4 or more, it is possible to reduce the magnetic coupling degree and the AC loss.

Figure 3:
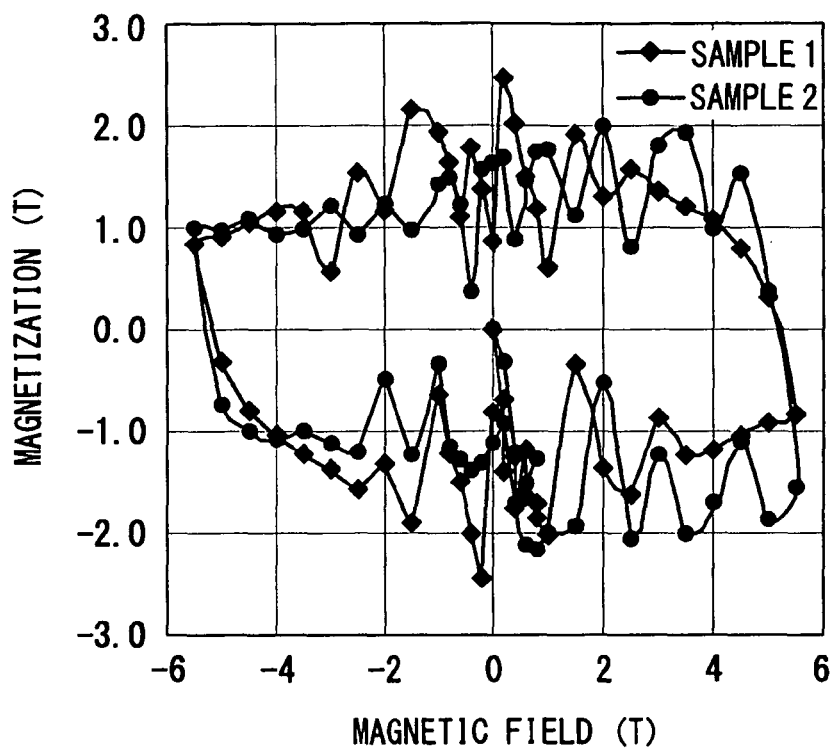
FIG. 3 is a graph showing a measurement result of magnetic characteristics for determining optimum conditions in the basic structure of the precursor for $Nb_3Sn$ superconductor wire.
Figure 4:
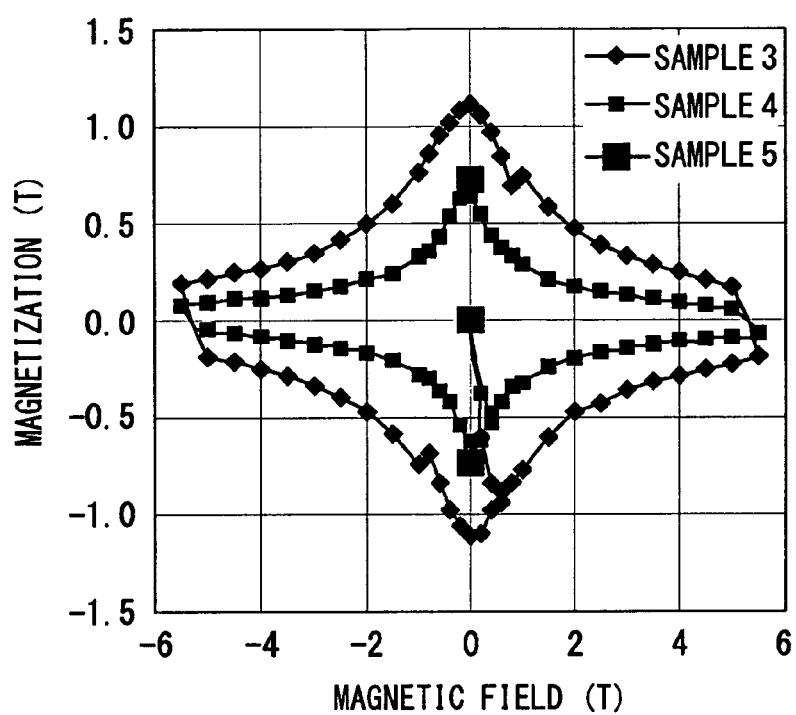
FIG. 4 is a graph showing a measurement result of magnetic characteristics for determining optimum conditions in the basic structure of the precursor for $Nb_3Sn$ superconductor wire.

Here, when the magnetic coupling between the superconductor filaments is small, an area surrounded by the magnetization curve shown in each of FIGS. 3 and 4 is small. The AC loss is generally classified roughly into magnetization hysteresis loss, coupling loss, and eddy current loss. When the variation of the external magnetic field is small, the magnetization hysteresis loss is dominant. Since this magnetization hysteresis loss is equivalent to a close are of the magnetization curve, the AC loss can be reduced by reducing the magnetic coupling degree.

Figure 6:
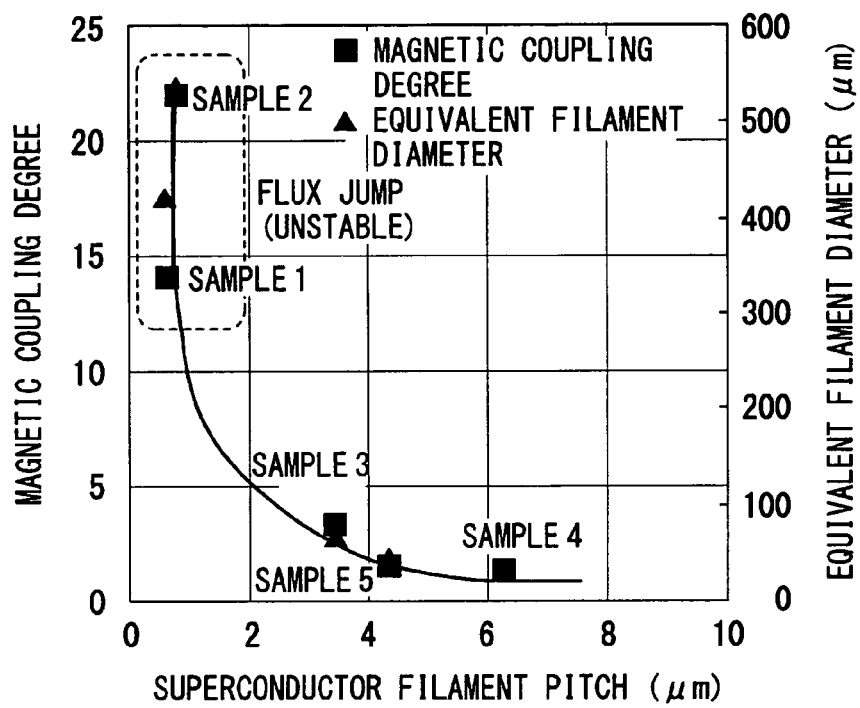
FIG. 6 is a graph showing a relationship between the magnetic characteristics and the superconductor filament pitch for determining optimum conditions in the basic structure of the precursor for $Nb_3Sn$ superconductor wire.

FIG. 6 shows the relationship between the magnetic characteristics and the superconductor filament pitch relating to determination of the optimum condition in the superconductor wire obtained by carrying out the heat treatment on the

TABLE 1

| | Sample No. | Wire diameter (mm) | Nb core Diameter (μm) | Nb Pitch (μm) | Nb Core Center Pitch (μm) | Nb Core Center Pitch/Nb core diameter | Cu/Nb ratio | Magnetic Stability |
|---|---|---|---|---|---|---|---|---|
| Comparative Example 1 | 1 | 0.50 | 29.7 | 3.8 | 33.5 | 1.13 | 0.25 | Unstable |
| Comparative Example 2 | 2 | 1.00 | 24.5 | 3.4 | 27.9 | 1.14 | 0.30 | Unstable |
| Example 1 | 3 | 1.00 | 22.1 | 5.8 | 27.9 | 1.26 | 0.59 | Good |
| Example 2 | 4 | 0.50 | 25.2 | 8.9 | 34.1 | 1.35 | 0.82 | Good |
| Example 3 | 5 | 0.50 | 27.0 | 7.2 | 34.2 | 1.27 | 0.61 | Good |

FIGS. 3 and 4 show measurement result of the magnetic characteristics relating to determination of the optimum condition in the basic structure of the precursor for a Nb$_3$Sn superconductor wire, respectively.

Referring to FIG. 3, it was shown that the magnetization is not uniformly varied in accordance with variation in the external magnetic field and the magnetization was unstable in the sample 1 (Comparative example 1) and the sample 2 (Comparative example 2). This phenomenon is the flux jump, which shows that the diameter of the superconductor filament is large or a group of narrow filaments are magnetically coupled so that the equivalent filament diameter $d_{eff}$ was increased. Referring to FIG. 4, it was shown that no flux jump was observed and magnetically stable in the samples 3 to 5 (Examples 1 to 3).

Figure 5:
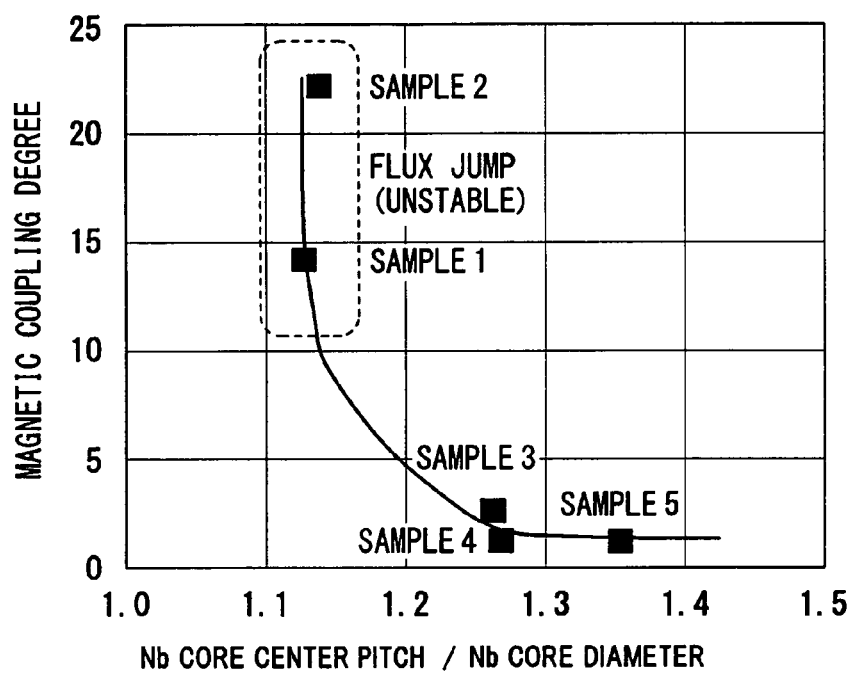
FIG. 5 is a graph showing a relationship between the magnetic characteristics and the Nb core pitch (Nb core center pitch/Nb core diameter) for determining optimum conditions in the basic structure of the precursor for $Nb_3Sn$ superconductor wire.

FIG. 5 shows the relationship between the magnetic characteristics (magnetic coupling degree) and the Nb core pitch relating to determination of the optimum condition in the superconductor wire obtained by carrying out the heat treatment on the basic structure of the precursor for a Nb$_3$Sn superconductor wire shown in FIG. 1.

basic structure of the precursor for a Nb$_3$Sn superconductor wire shown in FIG. 1. More specifically, FIG. 6 shows the relationship between the magnetic coupling degree and the superconductor filament pitch in the Nb$_3$Sn superconductor filament as well as the relationship between the equivalent diameter of the superconductor filament and the superconductor filament pitch.

Herein, the "superconductor filament pitch ($P_2$)" is an interval between adjacent Nb$_3$Sn superconductor filaments 31 (i.e. a minimum width of non-superconducting portions provided between adjacent Nb$_3$Sn superconductor filaments 31) referring to FIG. 2B. As shown in FIG. 2B, the superconductor filament 31 is Nb$_3$Sn generated by the heat treatment, an outer diameter of the Nb$_3$Sn superconductor filaments 31 is defined by an interface between an outer periphery of Nb$_3$Sn phase and the Cu-based matrix 30 (non-superconducting portion). As a result of the experiment for determining the optimum condition, when an absolute value of the filament pitch $P_2$ after the heat treatment is less than 0.5 μm, the magnetic coupling between the filaments 31 was increased, thereby caused the magnetic instability. When the absolute value of the filament pitch $P_2$ after the heat treatment is 0.5 μm or more, the magnetic coupling degree was decreased. Therefore, by providing the absolute value of the superconductor filament pitch $P_2$ after the heat treatment to be 0.5 μm or more, it is possible to provide the excellent magnetic stability and AC loss characteristic.

Referring to FIG. 6, the equivalent filament diameter of the superconductor filament can be expressed by a product of the filament diameter and the magnetic coupling degree. When an absolute value of the product of the filament diameter and the magnetic coupling degree exceeds about 300 μm, the magnetic instability is caused. Therefore, in the internal diffusion method for manufacturing a $Nb_3Sn$ wire by arranging a plurality of Nb cores and a plurality of Sn cores, it is preferable that the equivalent diameter is 300 μm or less.

A critical current density of each of the samples used for determining the optimum condition was 1500 A/mm² for the sample 1, 1450 A/mm² for the sample 2, 1300 A/mm² for the sample 3, 1150 A/mm² for the sample 4, and 1200 A/mm² for the sample 5, respectively in the external magnetic field of 12 T. Namely, the samples 3 to 5 with the excellent magnetic stability have the excellent critical current characteristic, although the critical current density of the samples 3 to 5 are slightly lower than the critical current density of the samples 1 and 2.

The heat-treated $Nb_3Sn$ superconductor wire was observed by scanning electron microscope. The thickness and the Sn concentration of a $Nb_3Sn$ crystal layer that is diffusion-generated around the Nb core were approximately uniformly distributed in axially symmetrical with respect to a center axis. Namely, a crystal structure and the Sn concentration distribution are axially symmetrical with respect to the center axis of the superconductor filament 31. In the present Example, since the Nb single core wires 2a and the Sn single core wires 2b are disposed in the cross section of the precursor 1 substantially uniformly, although the thickness of the Cu-coating 24 of the Nb core 23 is slightly varied, the Sn content supplied to the Nb core 23 in the dispersion reaction is uniform in the cross section of the precursor 1. As a result, the occupation ratio of the superconductor filaments 31 having the excellent critical current density can be increased.

Further, it is possible to control the thickness of the $Nb_3Sn$ layer generated around the Nb core 23, by appropriately selecting the heat treatment condition for the precursor 1 for a $Nb_3Sn$ superconductor wire in the present Example. Therefore, it is possible to provide a structure in which Nb having the ductility is disposed in the $Nb_3Sn$ superconductor filament 31 which is mechanically weak, by remaining a non-reacted Nb core at the time of finishing the heat treatment.

As to the single core wires to be used in the precursor 1 for a $Nb_3Sn$ superconductor wire in the present Example, the Nb-based single core wire 2a and the Sn-based single core wire 2b have the same cross sectional shape and the same outer periphery shape. Therefore, in the present Example, the modification of layout arrangement of the Nb-based signal core wires 2a and the Sn-based single core wires 2b is easy, and the area reduction workability is excellent.

As to the composition of the Nb-based core to be used in the precursor for $Nb_3Sn$ superconductor wire in the present Example, the same effect as the pure Nb core may be provided by using a Nb-alloy such as Nb—Ta alloy containing Nb doped with Ta. As to the composition of the Sn-based core, the same effect as the pure Sn core may be provided by using a Sn-alloy doped with Ti, Ge or the like.

Further, as to the composition of the Nb-based core to be used in the precursor 1 for $Nb_3Sn$ superconductor wire in the present Example, the area reduction workability can be improved by using the Nb-alloy such as the Nb—Ta alloy containing Nb doped with Ta, so that it is possible to easily keep the regularity of the single core arrangement in the cross section of the precursor processed until the final configuration. As to the composition of the Sn-based core to be used in the precursor for $Nb_3Sn$ superconductor wire in the present Example, the critical current characteristics of the heat-treated $Nb_3Sn$ superconductor wire can be improved by using the Sn-alloy doped with Ti, Ge or the like.

Example 4

Figure 7:
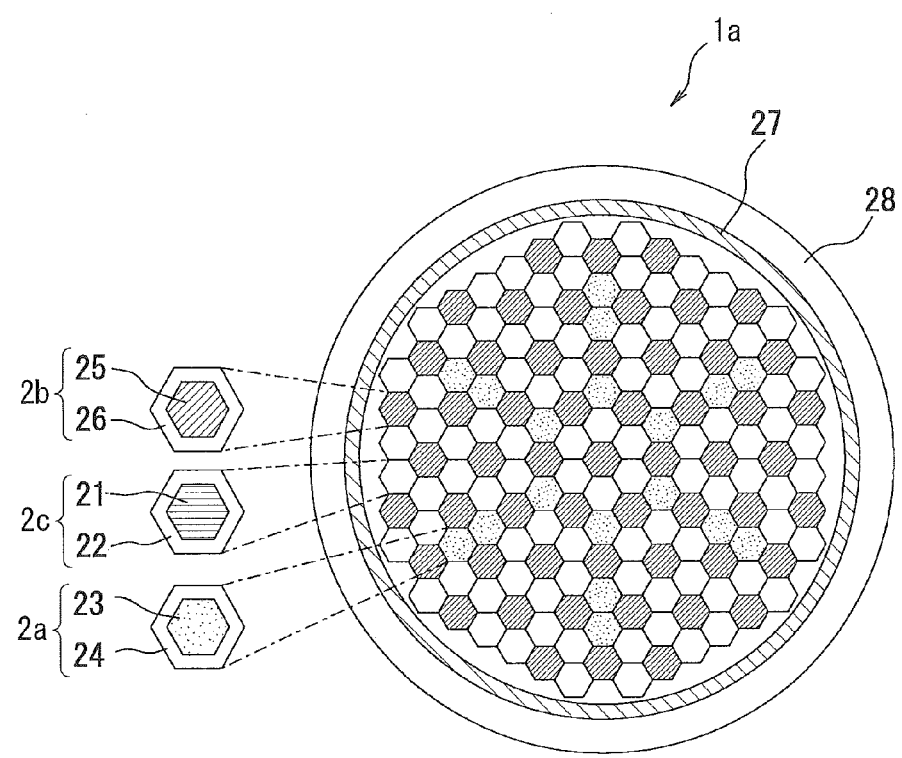
FIG. 7 is a cross-sectional view of a precursor for $Nb_3Sn$ superconductor schematically showing an example of another basic structure thereof.

FIG. 7 is a schematic diagram showing an example of basic structure of a precursor 1a for a $Nb_3Sn$ superconductor wire in Example 4. More specifically, FIG. 7 shows a schematic cross sectional view of another basic structure of the precursor 1a for a $Nb_3Sn$ superconductor wire.

The precursor 1a for a $Nb_3Sn$ superconductor wire in Example 4 includes a plurality of first Nb single core wires 2a each of which comprises a Nb core 23 and a Cu-coating 24 (thick) for coating the Nb core 23, a plurality of Sn single core wires 2b each of which comprises a Sn core 25 and a Cu-coating 26 for coating the Sn core 25, a plurality of second Nb single core wires 2c each of which comprises a Nb core 21 and a Cu-coating 22 (thin) for coating the Nb core 21, a diffusion barrier 27 for coating the first Nb single core wires 2a, the Sn single core wires 2b and the second Nb single core wires 2c that are disposed in a predetermined arrangement, and a stabilized Cu 28 contacting to an outer periphery of the diffusion barrier 27. Herein, the thickness of the Cu-coating 22 is thinner than the thickness of the Cu-coating 24.

In the precursor 1a for a $Nb_3Sn$ superconductor wire in Example 4, the Nb-based single core wires having the thick Cu-coating, i.e. having the cross sectional area ratio of the Cu-based coating to the Nb-based core (i.e. Cu-based coating/Nb-based core) of 0.4 or more are radially disposed in the cross section of the precursor. In other words, the first Nb single core wires 2a having the thick Cu-coating 24 and the Sn single core wires 2b are arranged as shown in FIG. 7. In the final configuration after the heat treatment, the Sn single core wire 2b including the Sn core 25 is not processed to be a superconductor filament, so that the Sn single core wire 2b does not affect on the magnetic coupling. Therefore, the columns of the first and second Nb single core wires 2a, 2c, which are arranged radially and straightly from a center of the wire toward the outer periphery of the wire, are disposed regularly in a circumferential direction without disturbing the regular arrangement in the cross section as much as possible.

The precursor for a $Nb_3Sn$ superconductor wire in Example 4 is manufactured as explained below.

Firstly, a Nb rod (which will be processed into a Nb core 23 as a final configuration) with an outer diameter of 20 mm was inserted into a Cu pipe with an outer diameter of 25.5 mm and an inner diameter of 20.2 mm. Thereafter, the Cu pipe accommodating the Nb rod was processed by the area reduction process to have a hexagonal cross section in which a spacing between opposite sides is 1.7 mm, thereby manufactured Nb single core wires 2a (i.e. the first Nb single core wires 2a coated with a thick Cu-coating 24). Similarly, a Nb rod (which will be processed into a Nb core 21 as a final configuration) with an outer diameter of 20 mm was inserted into a Cu pipe with an outer diameter of 22.5 mm and an inner diameter of 20.2 mm. Thereafter, the Cu pipe accommodating the Nb rod was processed by the area reduction process to have a hexagonal cross section in which a spacing between opposite sides is 1.7 mm, thereby manufactured Nb single core wires 2c (i.e. the second Nb single core wires 2c coated with a thin Cu-coating 22). In the meantime, a Sn-alloy rod (which will be processed into a Sn core 25 as a final configuration) having an outer diameter of 15.9 mm was inserted into a Cu pipe with an outer diameter of 19.4 mm and an inner diameter of 16.3 mm. Thereafter, the Cu pipe accommodating the Sn-alloy rod was processed by the area reduction process to have a hexagonal cross-section in which a spacing between opposite sides is 1.7 mm, thereby manufactured Sn single core wires 2b (each of which comprises a Sn core 25 coated with a Cu-coating 26).

Next, referring to FIG. 7, the Nb single core wires 2a coated with the thick Cu-coating 24 (18 in number), the Nb single core wires 2c coated with the thin Cu-coating 22 (54 in number), and Sn single core wires 2b (37 in number) a total number of which is 109 are disposed in a Cu pipe (which will be processed into a stabilized Cu 28 as a final configuration) with an outer diameter of 25.6 mm and an inner diameter of 21.2 mm. Five layers (turns) of Ta-sheet (which will be processed into a diffusion barrier 27 as a final configuration) with a thickness of 0.2 mm was inserted between the Cu pipe and a bundle of the wires. A multicore composite wire assembled as described above was processed by the area reduction process, to form a Nb$_3$Sn precursor 1a with a wire diameter of 0.5 mm.

As a result of evaluating the cross sectional structure of the precursor 1a in Example 4, the Cu/Nb ratio of the first Nb single core wire 2a was 0.6 and the Cu/Nb ratio of the second Nb single core wire 2c was 0.3.

Successively, the heat treatment was carried out on the precursor 1a at a temperature of 210° C. for 100 hours, at a temperature of 400° C. for 50 hours, and at a temperature of 700° C. for 150 hours, thereby manufactured a Nb$_3$Sn superconductor wire. In a region of the Nb single core wires 2a coated with the thick Cu-coating 24 (having the cross sectional area ratio of Cu/Nb of 0.4 or more), the core center pitch P$_1$ was 1.2 times or more of the core diameter D$_1$. In observation of the cross section of the Nb$_3$Sn superconductor wire, the Cu/Nb ratio of the first Nb single core wire 2a was 0.6 and the Cu/Nb ratio of the second Nb single core wire 2c was 0.3. Converting the Cu/Nb ratio into the Nb core pitch (i.e. the ratio of the core center pitch P$_1$ to the core diameter D$_1$), the Nb core pitch of the first Nb single core 23 was 1.26 and the Nb core pitch of the second Nb single core 21 was 1.14.

As a result of evaluating the characteristics of the Nb$_3$Sn superconductor wire, the effective filament diameter d$_{eff}$ was 100 μm, and the critical current density Jc was about 1350 A/mm$^2$ in a magnetic field of 12 T. Therefore, all of the excellent critical current density, AC loss characteristics, and magnetism stability were provided. Even in the case of measuring the magnetic characteristics of this superconductor wire in the magnetic field region of ±5T, the flux jump (magnetic instability) did not occur and the energization characteristic was stable in the critical current measurement.

Example 5

Figure 8:
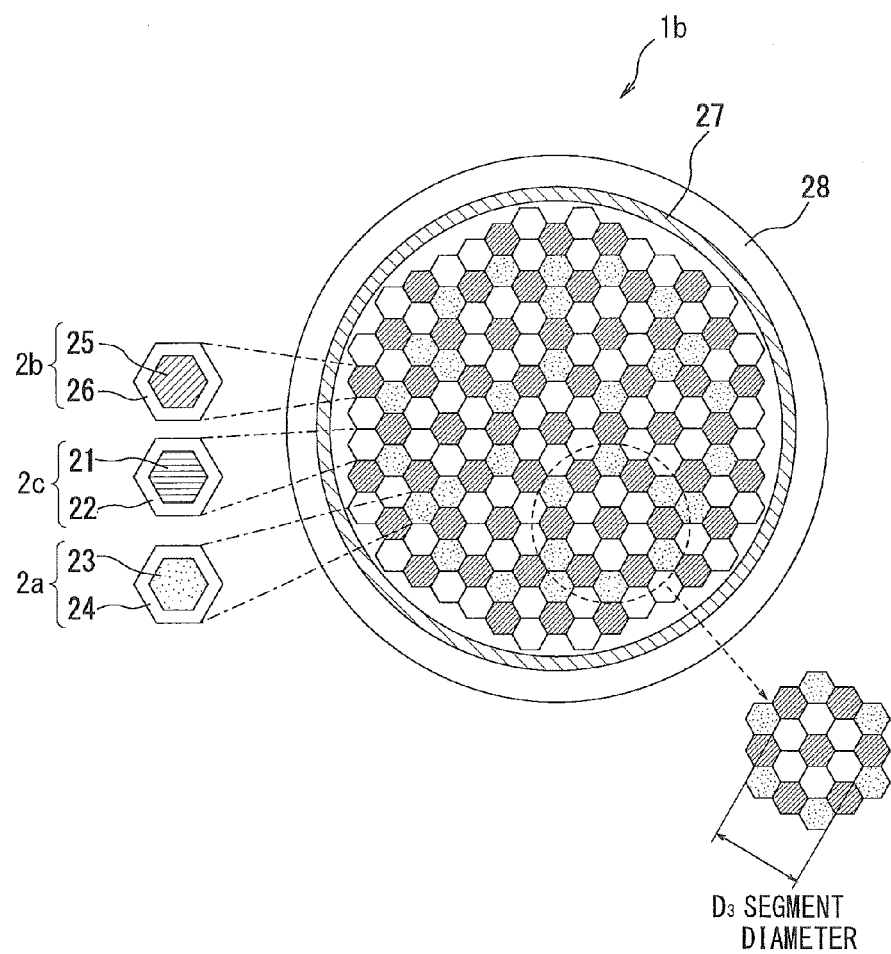
FIG. 8 is a cross-sectional view of a precursor for $Nb_3Sn$ superconductor schematically showing an example of a still another basic structure thereof and dimensions of a Nb core-dense region.

FIG. 8 is a schematic diagram showing an example of basic structure of a precursor 1b for a Nb$_3$Sn superconductor wire in Example 5. More specifically, FIG. 8 shows a schematic cross sectional view of another basic structure of the precursor 1b for a Nb$_3$Sn superconductor wire, and a configuration of a region in which the Nb core wires are densely disposed.

Similarly to Example 4, first and second Nb single core wires 2a, 2c and Sn single core wires 2b were manufactured. Thereafter, a precursor 1b for a Nb$_3$Sn superconductor wire having a wire diameter of 0.5 mm in which the single core wires 2a, 2b, and 2c are arranged as shown in FIG. 8 was manufactured. As shown in FIG. 8, the second Nb single core wires 2c coated with thin Cu-coating 22 are disposed in a hexagonal close-packed structure, and a region in which the second Nb single core wires 2c coated with thin Cu-coating 22 are adjacent to each other (i.e. segment) is sectioned by the first Nb single core wires 2a coated with the thick Cu-coating 24. A diameter D$_3$ of the segment comprising the second Nb single core wires 2c coated with thin Cu-coating 22 i.e. the region in which the second Nb single cores wires 2a coated with thin Cu-coating 22 are adjacent to each other is an interval between an opposite outer sides of a honeycomb shape shown in an accessory view of FIG. 8.

Successively, the heat treatment was carried out on the precursor 1b at a temperature of 210° C. for 100 hours, at a temperature of 400° C. for 50 hours, and at a temperature of 700° C. for 150 hours, thereby manufactured a Nb$_3$Sn superconductor wire. As a result of evaluating the characteristics of the Nb$_3$Sn superconductor wire, the effective filament diameter d$_{eff}$ was 70 μm, and the critical current density Jc was about 1380 A/mm$^2$ in a magnetic field of 12 T. Therefore, all of the excellent critical current density, AC loss characteristics, and magnetism stability were provided. Even in the case of measuring the magnetic characteristics of this superconductor wire in the magnetic field region of ±5 T, the flux jump (magnetic instability) did not occur and the energization characteristic was stable in the critical current measurement.

In the region where the second Nb single core wires 2c were adjacent to each other, the superconductor filaments 31 were magnetically coupled to each other after the heat treatment for generating the Nb$_3$Sn. The effective filament diameter was approximately equal to the diameter D$_3$ of the segment.

In addition, samples of the precursor 1b, in which the diameter D$_3$ of the segment comprising the second Nb single core wires 2c coated with thin Cu-coating 22 i.e. the region in which the second Nb single cores wires 2c coated with thin Cu-coating 22 are adjacent to each other in Example 5 is varied, were manufactured. The effective filament diameter d$_{eff}$ and the magnetic stability of the superconductor wires obtained by heat-treating the precursor samples were evaluated. Similarly to the result as shown in FIG. 6, when the effective filament diameter d$_{eff}$ is 300 μm or less, i.e. the diameter D$_3$ of the segment is 300 μm or less, the magnetic instability does not occur. From the above result, not only in the case of the superconductor filament alone, but also in the case that the superconductor filaments are magnetically coupled to each other, the magnetic stability can be obtained by determining the effective filament diameter d$_{eff}$ of the superconductor filament showing the magnetic behavior to be equal to or less than a threshold of 300 μm. As to the diameter of the segment, the accessory view of FIG. 8 should be referred.

Examples 6 and 7

The basic structure of a precursor for a Nb$_3$Sn superconductor wire in each of Examples 6 and 7 is similar to that in Example 4.

In Example 6, the Cu/Nb ratio of the second Nb single core wire 2c is 0.5.

In Example 7, the Cu/Nb ratio of the first Nb single core wire 2a is 0.5.

Examples 8 and 9

The basic structure of a precursor for a Nb$_3$Sn superconductor wire in each of Examples 8 and 9 is similar to that in Example 5.

In Example 8, the Cu/Nb ratio of the second Nb single core wire 2c is 0.5.

In Example 9, the Cu/Nb ratio of the first Nb single core wire 2a is 0.5.

TABLE 2 shows the cross sectional structure of each precursor before the heat treatment and measurement result of superconducting characteristics of the superconductor wire after the heat treatment in comparative example 2 and Examples 1, 4 to 9. By comparing the comparative example and Examples, it is confirmed that the superconductor wires having both the excellent critical current characteristic and magnetic stability can be realized by combining two different Nb single core wires having different Cu/Nb ratios.

In the column "Cu/Nb cross sectional ratio" of TABLE 2, the value in the upper column indicates the Cu/Nb ratio of the second Nb single core wire 2c, while the value in the lower column indicates the Cu/Nb ratio of the first Nb single core wire 2a.

TABLE 2

| | Sample No. | Cu/Nb Cross sectional ratio | Superconductor filament pitch (μm) | Structure | Critical Current Density (A/mm$^2$) | Effective filament diameter (μm) | Magnetic stability |
|---|---|---|---|---|---|---|---|
| Comparative Example 2 | 2 | 0.3 | 0.3 | FIG. 1 | 1450 | 550 | Unstable |
| Example 1 | 3 | 0.6 | 3.4 | FIG. 1 | 1300 | 60 | Good |
| Example 4 | 6 | 0.3<br>0.6 | 0.3<br>3.4 | FIG. 7 | 1410 | 100 | Good |
| Example 5 | 7 | 0.3<br>0.6 | 0.3<br>3.4 | FIG. 8 | 1380 | 70 | Good |
| Example 6 | 8 | 0.5<br>0.6 | 2.6<br>3.4 | FIG. 7 | 1330 | 60 | Good |
| Example 7 | 9 | 0.3<br>0.5 | 0.3<br>2.6 | FIG. 7 | 1420 | 280 | Stable |
| Example 8 | 10 | 0.5<br>0.6 | 2.6<br>3.4 | FIG. 8 | 1310 | 60 | Good |
| Example 9 | 11 | 0.3<br>0.5 | 0.3<br>2.6 | FIG. 8 | 1410 | 200 | Stable |

It is preferable that at least one kind of the Nb single core wires have the Cu/Nb ratio of 0.4 or more so as to provide the excellent magnetic stability. Namely, it is preferable that the Nb single core wires comprise the Nb single core wires having the Cu/Nb ratio of 0.4 or more.

As shown in FIG. 5, the effect of the Nb core pitch (i.e. Nb core center pitch/Nb core diameter), thus, the Cu/Nb ratio on the magnetic stability has a transition region. As shown in TABLE 1, when the Cu/Nb ratio is 0.3, the magnetic characteristics are unstable. On the other hand, when the Cu/Nb ratio is 0.59, the magnetic characteristics are good. Further, as shown in TABLE 2, when the first Nb single core wire 2a has the Cu/Nb ratio of 0.5 and the second single core wire 2c has the Cu/Nb ratio of 0.3 in Examples 7 and 9, the magnetic characteristic in each Example was stable. Further, as described above, the Cu/Nb ratio of around 0.4 is assumed as a threshold.

On the other hand, as to an upper limit, as shown in TABLE 1 and TABLE 2, when the Cu/Nb ratio is 0.6 or more, no difference in the characteristics was observed (saturated). The upper limit for the Cu/Nb ratio may be 0.6, since the cost will be increased and the effective filament diameter will be reduced when the Cu/Nb ratio exceeds 0.6.

Example 10

By using the precursor for a Nb$_3$Sn superconductor wire obtained in Example 1, a solenoidal coil with a winding bobbin having an inner diameter of 100 mm, an outer diameter of 150 mm and an axial length of 100 mm was manufactured. The stabilized Cu and the diffusion barrier are removed from both ends of the wound superconductor wire, and both ends are fixed to be closed together. Thereafter, the coil and the both ends of the superconductor wire were heat-treated. The heat treatment was carried out at a temperature of 210° C. for 100 hours, at a temperature of 400° C. for 50 hours, and at a temperature of 650° C. for 150 hours, so that non-reacted Nb core remains at the center of the Nb$_3$Sn superconductor filament. Thereafter, the Cu-coating at the both ends of the heat-treated wire was chemically removed to expose the superconductor filament inside the heat-treated wire. A persistent current circuit switch was connected in series to the superconductor filament by soldering a Pb—Bi superconducting alloy, to provide a persistent current drivable superconducting coil.

The object for leaving the non-reacted Nb core is to improve the mechanical characteristic by retaining Nb with the ductility inside the Nb$_3$Sn compound which is fragile. According to this structure, when a lead-wire of the coil after the heat treatment is superconductively-connected by removing the stabilized Cu to expose the internal Nb$_3$Sb filament, it is possible to reduce the damage of the filament at the time of this operation.

When this coil is excited, the Nb$_3$Sn superconductor wire was stably energized up to the critical current, and no magnetic instability such as flux jump was observed in the excitation process. In the persistent current mode of the superconductor coil, the magnetic field attenuation thereof was measured. The attenuation rate was 1 ppm/h. Namely, it is confirmed that the superconductor coil in Example 10 has the excellent performance that can be applied to a superconducting magnet for nuclear magnetic resonator analyzing apparatus, magnetic resonance imaging apparatus, and the like.

(Effects)

In the cross sectional structure of the Nb$_3$Sn superconductor wire, the region with high occupation ratio of Nb$_3$Sn filaments is not divided by a non-superconducting region but by a low occupation ratio region. According to the invention, it is possible to provide a precursor for a Nb$_3$Sn superconductor wire which is provided with excellent critical current characteristics, reduced AC loss and excellent magnetic stability, a method for manufacturing the same, a Nb$_3$Sn superconductor wire and a superconducting magnet system.

Although the invention has been described, the invention according to claims is not to be limited by the above-mentioned embodiments and examples. Further, please note that not all combinations of the features described in the embodiments and the examples are not necessary to solve the problem of the invention.

What is claimed is:

1. A method for manufacturing a precursor for a $Nb_3Sn$ superconductor wire, said method comprising:
    coating a Nb-based core with a Cu-based matrix to provide a plurality of Nb-based single core wires;
    coating a Sn-based core with a Cu-based matrix to provide a plurality of Sn-based single core wires;
    inserting the plurality of Nb-based single core wires and the plurality of Sn-based single core wires that are bundled regularly into a cylindrical diffusion barrier comprising Ta or Nb; and
    inserting a bulk comprising the plurality of Nb-based single core wires, the plurality of Sn-based single core wires and the diffusion barrier into a Cu-tube,
    wherein the plurality of Nb-based single core wires comprises Nb-based single core wires having a Cu/Nb ratio of 0.4 or more and Nb-based single core wires having a Cu/Nb ratio of less than 0.4,
    wherein the Cu/Nb ratio is a cross sectional area ratio of the Cu-based coating to the Nb-based core, and
    wherein a diameter of a region, in which the Nb-based single core wires having the Cu/Nb ratio of less than 0.4 are adjacent to each other, is 300 μm or less.

2. A method for manufacturing a precursor for a $Nb_3Sn$ superconductor wire, said method comprising:
    coating a Nb-based core with a Cu-based matrix to provide a plurality of Nb-based single core wires;
    coating a Sn-based core with a Cu-based matrix to provide a plurality of Sn-based single core wires;
    inserting the plurality of Nb-based single core wires and the plurality of Sn-based single core wires that are bundled regularly into a cylindrical diffusion barrier comprising Ta or Nb; and
    inserting a bulk comprising the plurality of Nb-based single core wires, the plurality of Sn-based single core wires, and the diffusion barrier into a Cu-tube;
    wherein the plurality of Nb-based single core wires comprises Nb-based single core wires having a Cu/Nb ratio of 0.4 or more and Nb-based single core wires having a Cu/Nb ratio of less than 0.4, wherein the Cu/Nb ratio is a cross sectional area ratio of the Cu-based coating to the Nb-based core,
    wherein the Nb-based single core wires having the Cu/Nb ratio of less than 0.4 are arranged to be adjacent to each other around one Sn-based single core wire in each of a plurality of segments, and
    wherein the plurality of segments are sectioned by the Nb-based single core wires having the Cu/Nb ratio of 0.4 or more and the Sn-based single core wires.

3. The method according to claim 1, wherein the cylindrical diffusion barrier comprises Ta.

4. The method according to claim 1, wherein the region, in which the Nb-based single core wires having the Cu/Nb ratio of less than 0.4 are adjacent to each other, comprises a Sn-based single core wire.

5. The method according to claim 4, wherein the Nb-based single core wires having the Cu/Nb ratio of less than 0.4 are arranged adjacent to each other around the Sn-based single core wire in each of a plurality of segments.

6. The method according to claim 5, wherein the plurality of segments are sectioned by the Nb-based single core wires having the Cu/Nb ratio of 0.4 or more and the Sn-based single core wires.

7. The method according to claim 1, further comprising:
    arranging radially the Nb-based single core wires having the Cu/Nb ratio of 0.4 or more in a cross section of the precursor.

8. The method according to claim 2, wherein the cylindrical diffusion barrier comprises Ta.

9. The method according to claim 2, wherein a diameter of a region, in which the Nb-based single core wires having the Cu/Nb ratio of less than 0.4 are adjacent to each other around said one Sn-based single core wire, is 300 μm or less.

10. The method according to claim 2, further comprising:
    arranging radially the Nb-based single core wires having the Cu/Nb ratio of 0.4 or more in a cross section of the precursor.

* * * * *